(12) United States Patent
Tokuda (10) Patent No.: US 9,171,638 B2
(45) Date of Patent: Oct. 27, 2015

(54) NONVOLATILE STORAGE DEVICE, INTEGRATED CIRCUIT DEVICE, AND ELECTRONIC APPARATUS

(71) Applicant: SEIKO EPSON CORPORATION, Tokyo (JP)

(72) Inventor: Yasunobu Tokuda, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 208 days.

(21) Appl. No.: 13/857,418

(22) Filed: Apr. 5, 2013

(65) Prior Publication Data
US 2013/0265824 A1    Oct. 10, 2013

(30) Foreign Application Priority Data
Apr. 10, 2012  (JP) ................. 2012-089361

(51) Int. Cl.
| | |
|---|---|
| G11C 11/00 | (2006.01) |
| G11C 16/34 | (2006.01) |
| G11C 29/12 | (2006.01) |
| G11C 29/48 | (2006.01) |
| G11C 16/04 | (2006.01) |
| G11C 29/24 | (2006.01) |

(52) U.S. Cl.
CPC .......... G11C 16/349 (2013.01); G11C 29/1201 (2013.01); G11C 29/48 (2013.01); *G11C 16/0433* (2013.01); *G11C 29/24* (2013.01)

(58) Field of Classification Search
CPC ....................................... G11C 11/56
USPC ........................................... 365/148
See application file for complete search history.

(56) References Cited

U.S. PATENT DOCUMENTS

| | | | |
|---|---|---|---|
| 2002/0181280 A1* | 12/2002 | Hamaguchi et al. | 365/185.09 |
| 2005/0104103 A1 | 5/2005 | Hamamoto et al. | |
| 2007/0285969 A1* | 12/2007 | Toda et al. | 365/148 |
| 2011/0075488 A1* | 3/2011 | Hosono et al. | 365/185.18 |

FOREIGN PATENT DOCUMENTS

| | | |
|---|---|---|
| JP | A-2002-358794 | 12/2002 |
| JP | A-2005-92962 | 4/2005 |

* cited by examiner

*Primary Examiner* — Amir Zarabian
*Assistant Examiner* — Min Huang
(74) *Attorney, Agent, or Firm* — Oliff PLC (57) ABSTRACT

A latch circuit that latches stored data of a nonvolatile storage device used for setting the function of a semiconductor device and adjusting the characteristics of the semiconductor device required a dedicated input-output circuit for a test of the semiconductor device. By providing a dummy storage device, it becomes possible to perform a test of the semiconductor device without providing a dedicated input-output circuit.

12 Claims, 6 Drawing Sheets

NONVOLATILE STORAGE DEVICE, INTEGRATED CIRCUIT DEVICE, AND ELECTRONIC APPARATUS

The entire disclosure of Japanese Patent Application No. 2012-089361, filed Apr. 10, 2012 is expressly incorporated by reference herein.

BACKGROUND

1. Technical Field

The present invention relates to nonvolatile storage devices, integrated circuit devices, electronic apparatuses, and the like.

2. Related Art

A nonvolatile storage device can hold memory without being supplied with power and is used in various electronic apparatuses. Here, an electronic apparatus installed in an automobile or the like that requires safety requires high reliability. In such an electronic apparatus, a nonvolatile storage device also requires high data reliability.

For example, the inventions of JP-A-2002-358794 (hereinafter Patent Document 1) and JP-A-2005-92962 (hereinafter Patent Document 2) include a redundant memory cell which is used in place of a memory cell that has developed a defect and thereby increase data reliability. Patent Document 1 proposes a technique of speeding up the read speed by reducing the wiring load when the redundant memory cell is used and Patent Document 2 proposes a technique that makes it possible to perform accurate and stable reading by providing a read path separately when the redundant memory cell is used.

In recent years, a high-capacity (for example, a few gigabit) nonvolatile storage device such as flash memory can be used. At this time, as in the inventions of Patent Document 1 and Patent Document 2, providing a redundant memory cell is suitable as a method for increasing reliability.

On the other hand, there is demand for low-capacity and inexpensive OTP (one time programmable) memory for performing, for example, calibration of analog circuits in which variations can occur depending on products. The OTP memory is nonvolatile memory that allows writing only once. For example, FAMOS (floating gate avalanche-injection MOS) is a type of nonvolatile memory and allows written information to be deleted by ultraviolet rays. However, the FAMOS can be used as low-capacity OTP memory after being covered with a commonly-used IC package with no window for ultraviolet irradiation.

In such uses, FAMOS of tens of bits, for example, is sometimes used. At this time, providing a redundant memory cell results in an increase in circuit area at a large ratio thereof to the whole portion and is not practical for a method for increasing reliability.

Therefore, as a method for increasing the reliability of low-capacity and inexpensive OTP memory, to perform satisfactory analysis in the event of a breakdown, it is necessary to reduce the number of places that cannot be tested.

SUMMARY

An advantage of some aspects of the invention is to provide a nonvolatile storage device and the like that can test the value of a latch circuit that holds the value of a memory cell, the value of the latch circuit whose test has been difficult in the past, without providing a dedicated input-output circuit separately.

(1) An aspect of the invention is directed to a nonvolatile storage device in which memory cells, each including a floating gate, are arranged in an array in a row direction and a column direction perpendicular to the row direction, and which outputs a value of the memory cell selected by a row address and a column address from a first output circuit, the nonvolatile storage device including: a second output circuit including a bistable circuit that is electrically connected to the memory cell via a switch that is controllable by the row address and holds and outputs a value of the memory cell selected by the row address; and test cells arranged in an array in such a way that each test cell forms a pair with at least one of the memory cells, the test cells each outputting, when being selected by the row address and the column address, from the first output circuit, the value held by the bistable circuit to which the test cell is electrically connected.

In the nonvolatile storage device according to the aspect of the invention, the memory cells, each including a floating gate, are arranged in an array in the row direction and the column direction. Then, the value of the memory cell selected by the row address and the column address is output from the first output circuit. For example, the first output circuit may be a sense amplifier and may output the value of the selected memory cell to the outside of the nonvolatile storage device.

The nonvolatile storage device according to the aspect of the invention has, in addition to the first output circuit, the second output circuit including the bistable circuit that holds the value of the memory cell selected by the row address. Here, the bistable circuit may be a latch circuit, for example, and a flip-flop may be used. The bistable circuit may be placed in each column of the memory cells arranged in an array, for example. At this time, each bistable circuit can hold the value of the memory cell in the same column, the memory cell selected by the row address.

From the second output circuit, the value of the memory cell, the value held in the bistable circuit, is output. At this time, unlike the first output circuit, the second output circuit can output a plurality of values. The values output from the second output circuit may be sent to, for example, a circuit forming an integrated circuit device with the nonvolatile storage device via a parallel bus.

Here, there is a limit to the number of connecting terminals (pins) of the integrated circuit device. For example, it is possible to assign the output from the first output circuit to one pin of the integrated circuit device, but it is difficult to assign the parallel bus from the second output circuit to the pins of the integrated circuit device. However, from the viewpoint of increasing reliability, it is preferable to perform a direct test of a plurality of values output from the second output circuit so that, in the event of a breakdown, the cause of the breakdown can be analyzed.

The nonvolatile storage device according to the aspect of the invention includes the test cells arranged in an array in the same manner as the memory cells, the test cells each being capable of outputting, when being selected by the row address and the column address, from the first output circuit, the value held by the bistable circuit to which the test cell is electrically connected, that is, the value that is output from the second output circuit. This makes it possible to test directly a plurality of values that are output from the second output circuit and increase reliability.

At this time, the test cell receives the value held by the bistable circuit, but this does affect the output from the second output circuit, and the nonvolatile storage device can continuously perform normal operation. In addition, since the test cell is selected in the same manner as the other memory cells and makes the first output circuit output the value held by the bistable circuit, there is no need for a special circuit for selecting the test cell and a special input-output circuit for accessing the test cell, and there is no possibility that the circuit size is increased greatly.

As a result, the nonvolatile storage device according to the aspect of the invention can test the value of the bistable circuit (for example, the latch circuit) that holds the value of the memory cell, the value of the bistable circuit whose test has been difficult in the past, without providing a dedicated input-output circuit separately.

(2) The nonvolatile storage device may include a write circuit that writes, into the memory cell selected by the row address and the column address, an input value which is a value input from the outside of the nonvolatile storage device, and the second output circuit may be electrically connected to the write circuit via the switch that is controllable by the row address and can hold the input value in the bistable circuit and output the input value.

The nonvolatile storage device according to the aspect of the invention includes the write circuit that writes, into the memory cell selected by the row address and the column address, an input value which is a value input from the outside of the nonvolatile storage device. With the write circuit, it is possible to inject an electric charge into a floating gate of the selected memory cell.

Here, in the nonvolatile memory such as FAMOS, it is possible to delete written information by ultraviolet rays. However, a process of writing a test pattern into a memory cell as an input value and deleting the test pattern by ultraviolet rays requires a predetermined length of time. For example, it is sometimes necessary to make an adjustment to optimize the characteristics of a circuit that receives a value from the second output circuit by using a plurality of test patterns. At this time, it takes time to rewrite the test patterns, and there is a possibility that test costs are increased.

In the nonvolatile storage device according to the aspect of the invention, the second output circuit is electrically connected to the write circuit via the switch that is controllable by the row address and can hold an input value in the bistable circuit and output the input value. This makes it possible to perform rewriting promptly by directly making the bistable circuit hold a plurality of test patterns and reduce test costs.

At this time, an electrical connection between the second output circuit and the write circuit is controlled by the row address. As a result, when writing is performed on the bistable circuit of the second output circuit (that is, an electrical connection with the write circuit is established), it is possible to keep the other memory cells from being selected. This makes it possible to perform writing of the test pattern without affecting the other memory cells.

Therefore, it is possible to set arbitrary data (for example, a test pattern) in the bistable circuit of the second output circuit from the outside of the nonvolatile storage device without performing writing to the memory cell and conduct an efficient test on a circuit that receives a value from the second output circuit. In particular, it is highly effective in shortening deletion time for nonvolatile memory from which information is deleted by ultraviolet rays.

At this time, writing to the bistable circuit of the second output circuit is performed by use of the write circuit that writes an input value to the memory cell. As a result, since there is no need for a special input-output circuit, there is no possibility that the circuit size is increased greatly.

(3) In the nonvolatile storage device, the memory cell in an even-numbered column and the memory cell in one odd-numbered column which is next to the memory cell in the even-numbered column in the same row may store complementary values.

The nonvolatile storage device according to the aspect of the invention stores complementary values (hereinafter also referred to as complementary data) in two memory cells and performs multiplexing (duplication) of data on one value. As a result, the reliability of data of the nonvolatile storage device can be further increased.

(4) In the nonvolatile storage device, the memory cell may have a structure in which a FAMOS transistor including the floating gate and a selection transistor controlled by the row address are connected in series.

The nonvolatile storage device according to the aspect of the invention may be FAMOS. The FAMOS is used as OTP memory, which makes it possible to provide high-reliability OTP memory as described earlier.

(5) Another aspect of the invention is directed to an integrated circuit device including any of the nonvolatile storage devices described above.

(6) Still another aspect of the invention is directed to an electronic apparatus including the integrated circuit device described above.

Since the above aspects of the invention include the nonvolatile storage device with high data reliability, it is possible to increase the reliability of the integrated circuit device and the reliability of the electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail by using drawings. It should be understood that the embodiment described below is not meant to limit unduly the scope of the invention claimed in the appended claims in any way, and all the configurations described below are not always necessary structural features of the invention.

1. Circuit Diagram of a Nonvolatile Storage Device 1.1. Basic Configuration

Figure 1:
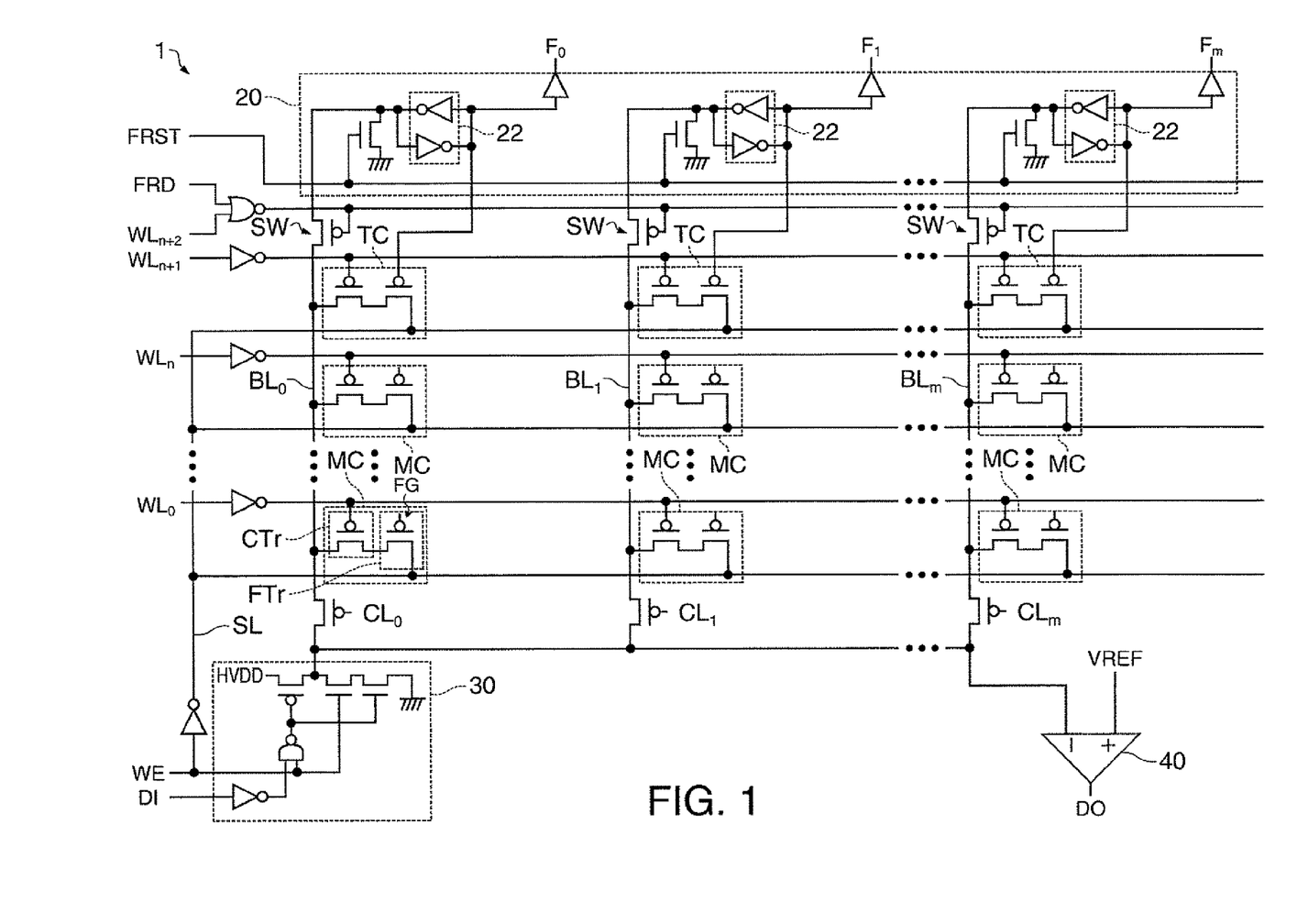
FIG. 1 is a circuit diagram of a nonvolatile storage device of a first embodiment.

FIG. 1 is a circuit diagram of a nonvolatile storage device of a first embodiment. A nonvolatile storage device 1 of this embodiment is a FAMOS (floating gate avalanche-injection MOS) storage device produced by being stacked on a semiconductor substrate. The nonvolatile storage device 1 has memory cells MC arranged in an array in a row direction (a vertical direction of the plane of paper) and a column direction (a horizontal direction of the plane of paper) Incidentally, FIG. 1 shows part of the nonvolatile storage device 1 and does not include all the elements included in the nonvolatile storage device 1.

Selection of the memory cell MC is performed by (n+1) word lines $WL_0$ to $WL_n$ and (m+1) bit lines $BL_0$ to $BL_m$, and writing and reading are performed. The word lines $WL_0$ to $WL_n$ are selectively activated based on a row address decoded by a row decoder (not shown). Incidentally, n and m are integers greater than or equal to 1. Selection of each of the bit lines $BL_0$ to $BL_m$ is performed by column selection lines $CL_0$ to $CL_m$, and the selected bit line is electrically connected to a write circuit 30 and a sense amplifier circuit 40 forming a first output circuit. Here, the column selection lines $CL_0$ to $CL_m$ are selectively activated based on a column address decoded by a column decoder (not shown).

The memory cells MC each have a structure in which a FAMOS transistor FTr including a floating gate FG and a selection transistor CTr whose selection is performed by the word lines $WL_0$ to $WL_n$ are connected in series.

In a state in which an electric charge is injected into the floating gate FG, a current flows when reading is performed. Thus, by detecting this, it is assumed that the value of the memory is "0". Moreover, in a state in which an electric charge is not injected into the floating gate FG, a current does not flow when reading is performed. Thus, by detecting this, it is assumed that the value of the memory is "1". For example, the value when an initial memory cell MC is read, the initial memory cell MC on which writing (that is, an injection of an electric charge into the floating gate FG) has not been performed, is "1".

As in FIG. 1, in the memory cell MC, the FAMOS transistor FTr and the selection transistor CTr are P-type transistors. Incidentally, the FAMOS transistor FTr and the selection transistor CTr can be formed as N-type transistors, not P-type transistors. Moreover, a source line SL is connected to the source of the FAMOS transistor FTr. Incidentally, the source line SL is a signal which is an inverted write signal WE, the write signal WE that is input to the write circuit 30.

Figure 5:
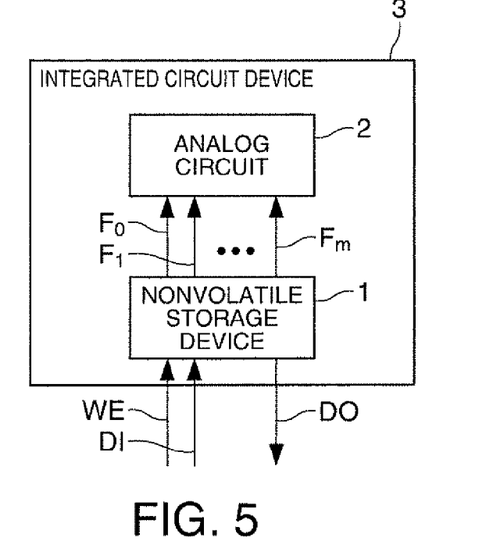
FIG. 5 is a block diagram of an integrated circuit device of an application example.

Here, as in FIG. 5, the nonvolatile storage device 1 of this embodiment forms part of an integrated circuit device 3. The nonvolatile storage device 1 outputs signals $F_0$ to $F_m$ used for trimming of an analog circuit 2 in the integrated circuit device 3 and outputs an output value DO to the outside of the integrated circuit device 3. Incidentally, a test of the nonvolatile storage device 1 is performed as a shipping inspection of the integrated circuit device 3 which is OTP memory. At this time, the test is performed by use of the write signal WE and an input value DI which can be controlled and the output value DO which can be observed. That is, the signals $F_0$ to $F_m$ are signals confined within the integrated circuit device 3.

Back in FIG. 1, an input-output circuit of the nonvolatile storage device 1 will be described. The sense amplifier circuit 40 forms the first output circuit that outputs the output value DO. The sense amplifier circuit 40 is electrically connected to each of the bit lines $BL_0$ to $BL_m$ of the selected memory cells MC. The sense amplifier circuit 40 compares the value of the selected memory cell MC with a reference voltage VREF and outputs "0" or "1" as the output value DO. The reference voltage VREF is a voltage set at a boundary level at which an electric charge may be input into the floating gate FG or may not be input into the floating gate FG.

In addition to the first output circuit, the nonvolatile storage device 1 includes a second output circuit 20 that outputs the signals $F_0$ to $F_m$. The output circuit 20 includes a plurality of latch circuits 22 that correspond to the columns of the memory cells MC arranged in an array. The values held in the latch circuits 22 are output to the analog circuit 2 (see FIG. 5) as the signals $F_0$ to $F_m$. The value held in the latch circuit 22 is not changed unless the value is rewritten and is continuously output. That is, since a switch SW remains in an off state unless the value held in the latch circuit 22 is rewritten, the switch SW is not influenced by writing and reading to and from the memory cell MC.

Incidentally, by setting an initialization signal FRST at "1" (high level), the latch circuits 22 are initialized in such a way that "1" is output therefrom. Then, by setting an initial read signal FRD at "1", since the latch circuits 22 are connected to the memory cells MC, it is possible to hold, in the latch circuits 22, the values of the memory cells MC in the rows selected at that time by the word lines $WL_0$ to $WL_n$.

Here, the nonvolatile storage device 1 is used as OTP memory, and, when a value is written into the memory cell MC, the write circuit 30 is used. By using the write circuit 30, it is possible to inject an electric charge into the floating gate FG of the FAMOS transistor FTr of the memory cell MC selected by the row address and the column address. The write circuit 30 performs writing based on the write signal WE that instructs, from the outside of the integrated circuit device 3 (FIG. 5), the write circuit 30 to perform writing and the input value DI. Here, the input value DI is the value of the selected memory cell MC.

The HVDD of the write circuit 30 is a voltage source that provides a high potential (for example, 6 V) used in writing. When it is determined that writing is not performed, the potential changes to a potential (for example, 1.8 V) for reading. This determination can be made based on the write signal WE, for example.

Incidentally, it is sometimes necessary to change the values of the signals $F_0$ to $F_m$. At this time, the activated word lines $WL_0$ to $WL_n$, are changed in such a way as to select the memory cells MC into which no value has been written. Then, writing is performed by use of the write circuit 30. Thereafter, by setting the initial read signal FRD at "1" while performing reading by selecting the memory cells MC on which writing has been newly performed, it is possible to change the values of the signals $F_0$ to $F_m$. Incidentally, in an example of FIG. 1, the values of the signals $F_0$ to $F_m$ can be changed n times.

1.2. Comparison with a Comparative Example

Figure 2:
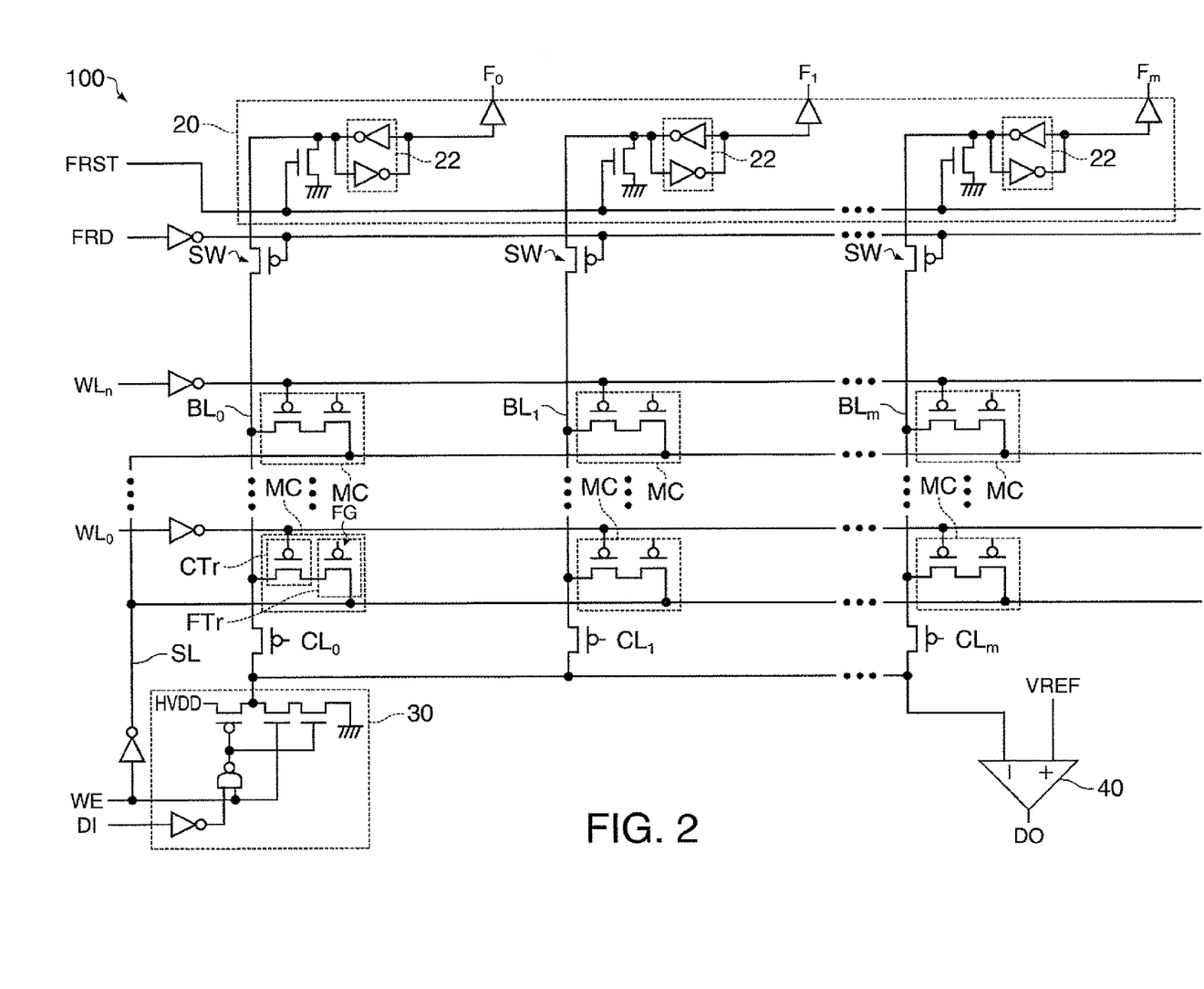
FIG. 2 is a circuit diagram of a nonvolatile storage device of a comparative example.

FIG. 2 is a circuit diagram of a nonvolatile storage device 100 of a comparative example for making the feature of the nonvolatile storage device 1 clear. Incidentally, since the same elements as those of FIG. 1 are identified with the same reference characters, their explanations will be omitted. The basic configuration of the nonvolatile storage device 1 described above is the same as the configuration of the nonvolatile storage device 100 of FIG. 2, and the nonvolatile storage device 1 described above can operate also by the nonvolatile storage device 100.

However, the nonvolatile storage device 100 has the following problems. First, the nonvolatile storage device 100 cannot output the signals $F_0$ to $F_m$ from the second output circuit 20 to the outside of the integrated circuit device 3 (see FIG. 5). This makes it impossible to perform a direct test to determine whether or not the signals $F_0$ to $F_m$ are desired values.

Moreover, for example, assume that the values of the signals $F_0$ to $F_m$ are used as the trimming values of the analog circuit 2 (see FIG. 5). At this time, it is sometimes necessary to select an optimum combination from the combinations of the signals $F_0$ to $F_m$ by actually measuring the characteristics of the analog circuit 2. In such a case, if a plurality of pieces of test data are written into the memory cells MC, when the integrated circuit device 3 is used as OTP memory after shipment, the number of times the memory cells MC can be rewritten is reduced. Moreover, when the test data is deleted by irradiation with ultraviolet rays, the test time becomes longer, resulting in an increase in test costs.

Unlike the nonvolatile storage device 100 of the comparative example, the nonvolatile storage device 1 of this embodiment includes test cells TC. The test cells TC are arranged in an array in the same manner as the memory cells MC, a selection of the test cell TC is performed by the word line $WL_{n+1}$ and the bit lines $BL_0$ to $BL_m$ in the same manner as the memory cells MC, and the selected test cell TC can be read via the sense amplifier circuit 40. That is, it is possible to output the value of the test cell TC to the outside of the integrated circuit device 3 (see FIG. 5) without providing a dedicated input-output circuit separately.

At this time, the test cells TC each include, in place of the FAMOS transistor FTr, a transistor that outputs the value of the latch circuit 22 in the same column. This makes it possible for the test cell TC to output the value of the latch circuit 22 in the same column to the outside of the integrated circuit device 3 (see FIG. 5). That is, the nonvolatile storage device 1 of this embodiment can perform a direct test to determine whether or not the values of the signals $F_0$ to $F_m$ are desired values. Incidentally, a selection transistor CTr included in the test cell TC is the same as that of the memory cell MC.

Moreover, unlike the nonvolatile storage device 100 of the comparative example, the nonvolatile storage device 1 of this embodiment can control the switch SW not only by the initial read signal FRD but also by the word line $WL_{n+2}$. The latch circuit 22 can be selected by the word line $WL_{n+2}$ in the same way as the memory cell MC is selected.

As a result, the write circuit 30 can directly write the input value DI also into the latch circuit 22. Therefore, even when a plurality of test patterns are needed, the number of times the memory cells MC that can be used after shipment can be rewritten is not reduced. Furthermore, there is no possibility that it takes time to delete the test data and test costs are increased. Incidentally, since the word line $WL_{n+2}$ and the word lines $WL_0$ to $WL_n$ for the memory cells MC are not selected at the same time, writing to the latch circuit 22 does not affect the memory cells MC.

Moreover, as is clear from a comparison with the nonvolatile storage device 100 of the comparative example, the nonvolatile storage device 1 of this embodiment does not require an addition of a new circuit for reading the test cell TC and a new input-output circuit. Therefore, as compared to the nonvolatile storage device 100 of the comparative example, there is no possibility that the circuit size is increased greatly.

As described above, the nonvolatile storage device 1 of this embodiment can directly test the value of the latch circuit 22 that holds the value of the memory cell MC, the value of the latch circuit 22 whose test has been difficult in the past, without providing a dedicated input-output circuit separately.

2. Modified Example

2.1. Basic Configuration

Figure 3:
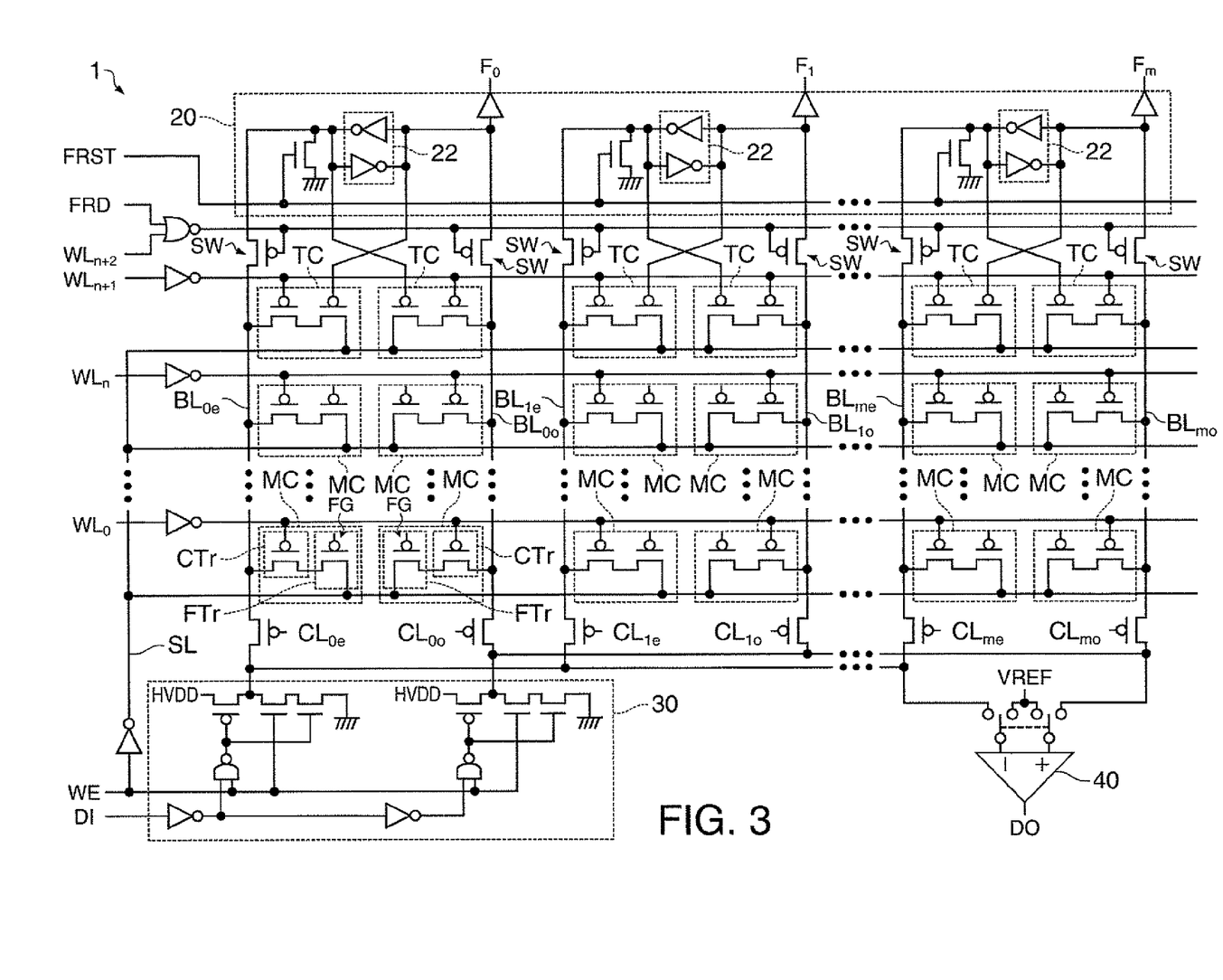
FIG. 3 is a circuit diagram of a nonvolatile storage device of a modified example.

FIG. 3 is a circuit diagram of a nonvolatile storage device of a modified example of the first embodiment. A nonvolatile storage device 1 of this modified example represents one value as two memory cells MC that store complementary data. Therefore, the data is duplicated, whereby data reliability can be further increased. Incidentally, FIG. 3 shows part of the nonvolatile storage device 1 and does not include all the elements included in the nonvolatile storage device 1. Moreover, the same elements as those of FIGS. 1 and 2 are identified with the same reference characters and their explanations are omitted, and only part which is different from the first embodiment will be described.

Selection of the memory cell MC is performed by (n+1) word lines $WL_0$ to $WL_n$ and (2×(m+1)) bit lines $BL_{0e}$ to $BL_{me}$ and $BL_{0o}$ to $BL_{mo}$, and writing and reading are performed. Incidentally, a subscript of the bit line is formed of a numeric (0 to m) and a trailing e or o. The numeric (0 to m) is the same as that of the first embodiment, and the trailing e represents an even-numbered bit line and o represents an odd-numbered bit line.

The word lines $WL_0$ to $WL_n$ are the same as those of the first embodiment. Selection of each of the bit lines $BL_{0e}$ to $BL_{me}$ and $BL_{0o}$ to $BL_{mo}$ is performed by column selection lines $CL_{0e}$ to $CL_{me}$ and $CL_{0o}$ to $CL_{mo}$, and the selected bit line is electrically connected to the write circuit 30 and the sense amplifier circuit 40 forming the first output circuit. Here, since a subscript of the column selection line is the same as the subscript of the bit line, the explanation thereof is omitted.

The values of the two memory cells MC connected to the even-numbered bit line and the odd-numbered bit line whose subscripts have a common numeric are complementary. For example, when the value of the memory cell MC connected to the word line $WL_0$ and the bit line $BL_{0e}$ is "0", the value of the memory cell MC connected to the word line $WL_0$ and the bit line $BL_{0o}$ is "1". However, in an initial state, the values of these memory cells MC are both "1". As a result, as is the case with the first embodiment, the sense amplifier circuit 40 performs a comparison with the reference voltage VREF, not a comparison between the even-numbered bit line and the odd-numbered bit line. That is, with a configuration in which a comparison between the even-numbered bit line and the odd-numbered bit line is performed, the output value DO becomes unstable when a memory cell MC in an initial state is read. This modified example avoids such a situation.

In reading of the nonvolatile storage device 1 of this modified example, one bit line, not a pair of an even-numbered bit line and an odd-numbered bit line, is selected. Then, a switch of the sense amplifier circuit 40 is selected in such a way that the selected one bit line is electrically connected to the sense amplifier circuit 40.

In reading of the nonvolatile storage device 1 of this modified example, the meaning of "0" and "1" of the output value DO differs depending on whether the selected bit line is an even-numbered bit line or an odd-numbered bit line. In the case of the even-numbered bit line, as in the first embodiment, in a state in which an electric charge is injected into the floating gate FG, "0" is output, and, in a state in which an electric charge is not injected into the floating gate FG, "1" is output. However, in the case of the odd-numbered bit line, since the polarity of the sense amplifier circuit 40 is reversed, in a state in which an electric charge is injected into the floating gate FG, "1" is output, and, in a state in which an electric charge is not injected into the floating gate FG, "0" is output.

In writing of the nonvolatile storage device 1 of this modified example, an even-numbered bit line and an odd-numbered bit line whose numerics of the subscripts are the same are used in pair. As in FIG. 3, the write circuit 30 of the nonvolatile storage device 1 of this modified example is formed of two configurations, each being the configuration of the first embodiment, connected to each other. At this time, since the input values DI are inverted, only one of the even-numbered bit line and the odd-numbered bit line becomes a bit line on the high potential (HVDD) side. Since an electric charge is injected only into the floating gate FG of the memory cell MC connected to the bit line on the high potential side, complementary data is written.

2.2. Comparison with a Comparative Example

Figure 4:
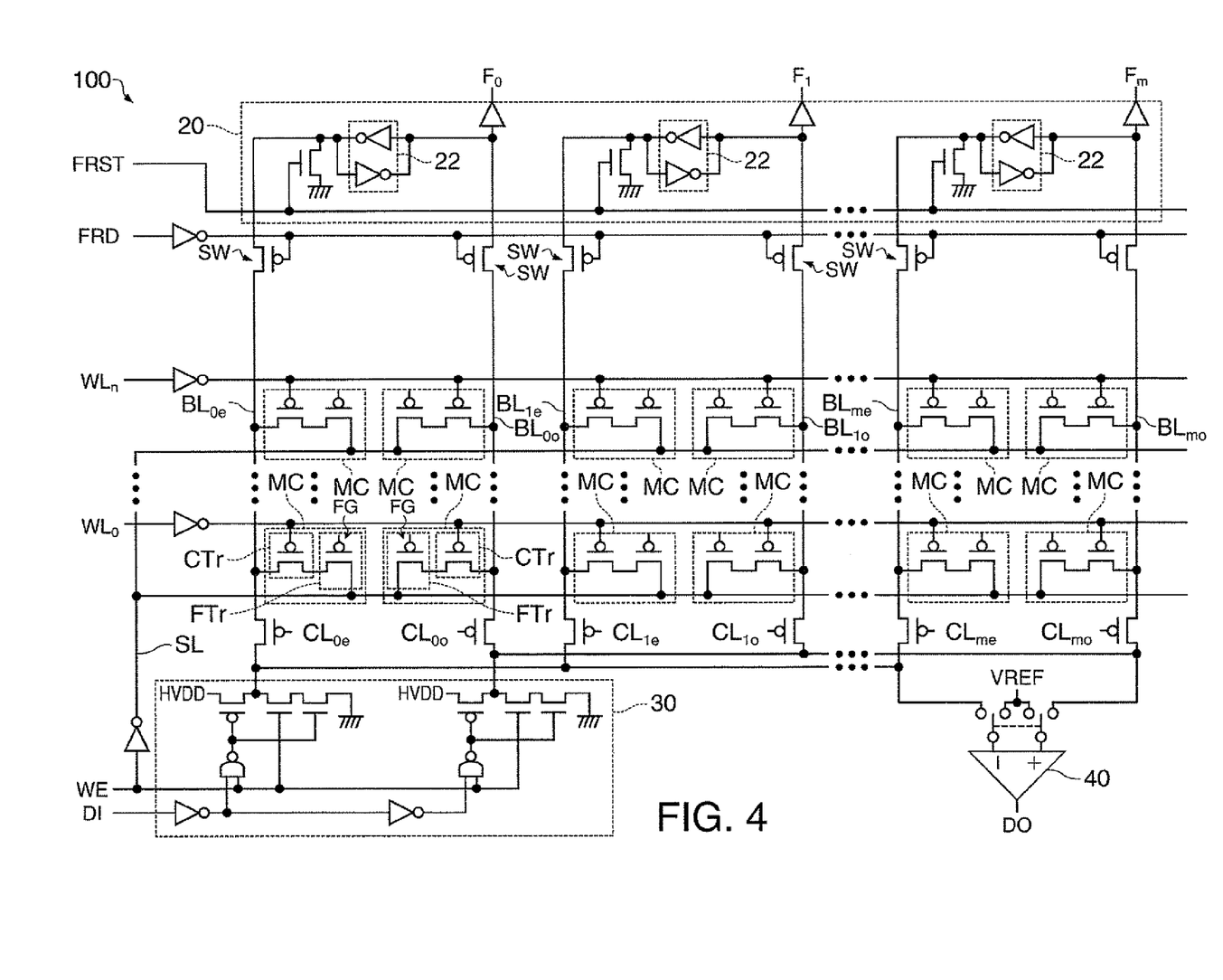
FIG. 4 is a circuit diagram of a nonvolatile storage device of a comparative example for the modified example.

FIG. 4 is a circuit diagram of a nonvolatile storage device 100 of a comparative example, which is different from the comparative example of FIG. 2, for making the feature of the nonvolatile storage device 1 of the modified example clear. Incidentally, since the same elements as those of FIGS. 1 to 3 are identified with the same reference characters, their explanations will be omitted. The basic configuration of the nonvolatile storage device 1 described above is the same as the configuration of the nonvolatile storage device 100 of FIG. 4, and the nonvolatile storage device 1 described above can operate also by the nonvolatile storage device 100.

However, first of all, with the nonvolatile storage device 100 of FIG. 4, it is impossible to perform a direct test to determine whether or not the signals $F_0$ to $F_m$ are desired values. Moreover, when there are a plurality of pieces of test data, it is necessary to write the data into the memory cells MC once, which reduces the number of times the memory cells MC can be rewritten after shipment or increases test costs due to the time required to delete the test data.

Unlike the nonvolatile storage device 100 of the comparative example of FIG. 4, the nonvolatile storage device 1 of the modified example includes test cells TC. The test cells TC are arranged in an array in the same manner as the memory cells MC, selection of the test cell TC is performed by the word lines $WL_{n+1}$ and the bit lines $BL_{0e}$ to $BL_{me}$ and $BL_{0o}$ to $BL_{mo}$ in the same manner as the memory cells MC, and the selected test cell TC can be read via the sense amplifier circuit 40. That is, it is possible to output the value of the test cell TC to the outside of the integrated circuit device 3 (see FIG. 5) without providing a dedicated input-output circuit separately.

At this time, the test cells TC each include, in place of the FAMOS transistor FTr, a transistor that outputs the value of the latch circuit 22 in the same column or an inverted value thereof. This makes it possible for the test cell TC to output the value of the latch circuit 22 in the same column to the outside of the integrated circuit device 3 (see FIG. 5). That is, the nonvolatile storage device 1 of the modified example can perform a direct test to determine whether or not the signals $F_0$ to $F_m$ are desired values. Incidentally, a selection transistor CTr included in the test cell TC is the same as that of the memory cell MC.

Moreover, unlike the nonvolatile storage device 100 of the comparative example of FIG. 4, the nonvolatile storage device 1 of the modified example can control the switch SW not only by the initial read signal FRD but also by the word line $WL_{n+2}$. The latch circuit 22 can be selected by the word line $WL_{n+2}$ in the same way as the memory cell MC is selected.

As a result, the write circuit 30 can directly write the input value DI also into the latch circuit 22. Therefore, even when a plurality of test patterns are needed, the number of times the memory cells MC that can be used after shipment can be rewritten is not reduced. Furthermore, there is no possibility that it takes time to delete the test data and test costs are increased. Incidentally, since the word line $WL_{n+2}$ and the word lines $WL_0$ to $WL_n$ for the memory cells MC are not selected at the same time, writing to the latch circuit 22 does not affect the memory cells MC.

Moreover, as is clear from a comparison with the nonvolatile storage device 100 of the comparative example of FIG. 4, the nonvolatile storage device 1 of the modified example does not require an addition of a new circuit for reading the test cell TC and a new input-output circuit. Therefore, as compared to the nonvolatile storage device 100 of the comparative example of FIG. 4, there is no possibility that the circuit size is increased greatly.

As described above, the nonvolatile storage device 1 of the modified example can directly test the value of the latch circuit 22 that holds the value of the memory cell MC, the value of the latch circuit 22 whose test has been difficult in the past, without providing a dedicated input-output circuit separately. Moreover, since the data is duplicated, reliability can be further increased.

3. Application Example

An application example of the nonvolatile storage device of this embodiment will be described. The nonvolatile storage device 1 can increase data reliability and can also be applied to an electronic apparatus installed in an automobile, an airplane, a ship, a railroad, and the like that require safety and an integrated circuit device used in the electronic apparatus.

First, as shown in FIG. 5, the nonvolatile storage device 1 of the first embodiment and the modified example can be part of the integrated circuit device 3. As described earlier, the nonvolatile storage device 1 outputs the signals $F_0$ to $F_m$ used for trimming of the analog circuit 2 in the integrated circuit device 3 and outputs the output value DO to the outside of the integrated circuit device 3. At this time, the values of the signals $F_0$ to $F_m$ can also be directly tested in a shipping inspection of the integrated circuit device 3. Moreover, to optimize the characteristics of the analog circuit 2, it is possible to output a plurality of test patterns from the signals $F_0$ to $F_m$ by the write signal WE and the input value DI without increasing test costs. This makes it possible to increase the reliability as the integrated circuit device 3.

Figure 6:
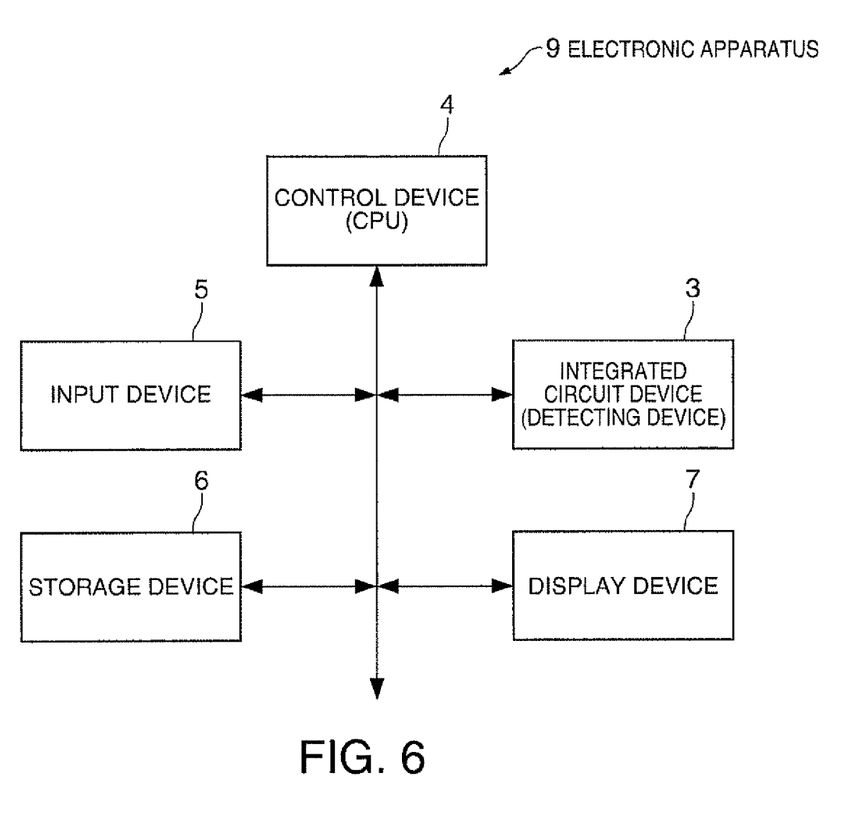
FIG. 6 is a block diagram of an electronic apparatus of an application example.

Moreover, an electronic apparatus 9 of FIG. 6 is another application example. The electronic apparatus 9 uses the integrated circuit device 3 as a kind of detecting device. In addition to the integrated circuit device 3, the electronic apparatus 9 includes a control device (CPU) 4, an input device 5, a storage device 6, and a display device 7. Incidentally, the component elements of the electronic apparatus 9 are not limited to these elements. Another element may be further added, and part of the elements may be deleted.

For example, the control device (CPU) 4 may make the integrated circuit device 3 process the data obtained from the input device 5 such as a camera or a sensor by a program product stored in the storage device 6 and detect the information to be displayed on the display device 7.

Figure 7:
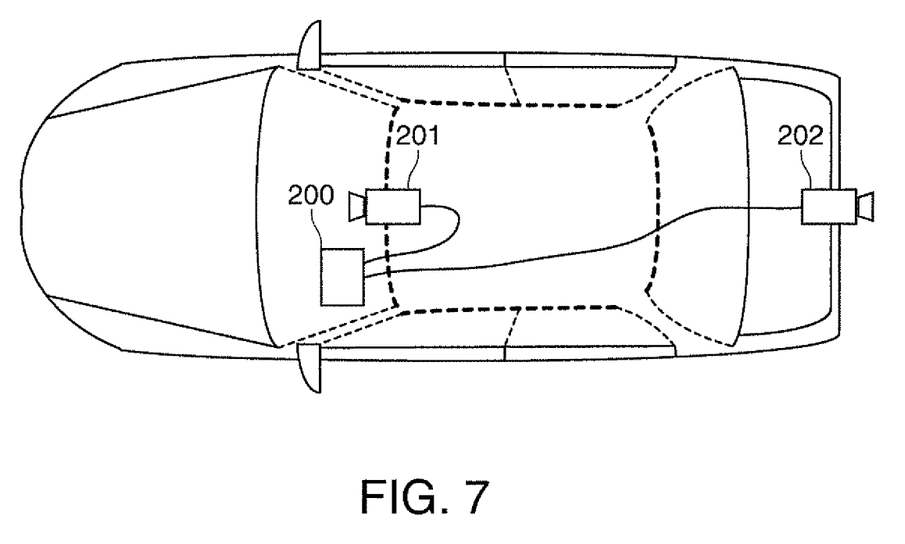
FIG. 7 is a diagram illustrating an example of the electronic apparatus of the application example.

FIG. 7 is a diagram illustrating a drive recorder 200 which is an example of the electronic apparatus in the application example. The drive recorder 200 is a device that stores necessary information by processing the images taken by a front camera 201 and a rear camera 202 (each corresponding to the input device 5 of FIG. 6) attached to an automobile, for example. For example, to optimize the brightness and the color of the images from the front camera 201 and the rear camera 202, data for adjustment of the analog circuit (data for adjustment) is sometimes needed. At this time, by using the above-described detecting device, that is, the integrated circuit device 3 including the nonvolatile storage device 1 of this embodiment and the analog circuit, in the drive recorder 200, it is possible to supply high-reliability data for adjustment.

Moreover, in addition to the drive recorder 200, in an electronic apparatus used in a brake system and an air bag system that are directly related to the safety of a vehicle, for example, the nonvolatile storage device 1 and the integrated circuit device 3 including the nonvolatile storage device 1 can also be used.

4. Others

The invention includes a configuration which is substantially identical to the configuration described in the embodiment (for example, a configuration having the same function, method, and result as those of the configuration described in the embodiment or a configuration having the same objective and effects as those of the configuration described in the embodiment). Moreover, the invention includes a configuration in which a nonessential portion of the configuration described in the embodiment is replaced with another portion. Furthermore, the invention includes a configuration that can obtain the same effects as those of the configuration described in the embodiment or achieve the same objective as that of the configuration described in the embodiment. In addition, the invention includes a configuration which is obtained by adding a publicly-known technique to the configuration described in the embodiment.

What is claimed is:

1. A nonvolatile storage device in which memory cells, each including a floating gate, are arranged in an array in a row direction and a column direction perpendicular to the row direction, the nonvolatile storage device that outputs a value of the memory cell selected by a row address and a column address from a first output circuit, the nonvolatile storage device comprising:
    a second output circuit including a bistable circuit that is electrically connected to the memory cell via a switch that is controllable by the row address and holds and outputs a value of the memory cell selected by the row address; and
    test cells arranged in an array in such a way that each test cell forms a pair with at least one of the memory cells, the test cells each outputting, when being selected by the row address and the column address, from the first output circuit, the value held by the bistable circuit to which the test cell is electrically connected.

2. The nonvolatile storage device according to claim 1, further comprising:
    a write circuit that writes, into the memory cell selected by the row address and the column address, an input value which is a value input from the outside of the nonvolatile storage device,
    wherein the second output circuit is electrically connected to the write circuit via the switch that is controllable by the row address and can hold the input value in the bistable circuit and output the input value.

3. The nonvolatile storage device according to claim 1, wherein
    the memory cell in an even-numbered column and the memory cell in one odd-numbered column which is next to the memory cell in the even-numbered column in the same row store complementary values.

4. The nonvolatile storage device according to claim 1, wherein
    the memory cell has a structure in which a FAMOS transistor including the floating gate and a selection transistor controlled by the row address are connected in series.

5. An integrated circuit device comprising the nonvolatile storage device according to claim 1.

6. An integrated circuit device comprising the nonvolatile storage device according to claim 2.

7. An integrated circuit device comprising the nonvolatile storage device according to claim 3.

8. An integrated circuit device comprising the nonvolatile storage device according to claim 4.

9. An electronic apparatus comprising the integrated circuit device according to claim 5.

10. An electronic apparatus comprising the integrated circuit device according to claim 6.

11. An electronic apparatus comprising the integrated circuit device according to claim 7.

12. An electronic apparatus comprising the integrated circuit device according to claim 8.

* * * * *